United States Patent [19]

Pfaff

[11] Patent Number: 5,108,302

[45] Date of Patent: Apr. 28, 1992

[54] TEST SOCKET

[76] Inventor: Wayne K. Pfaff, 309 Steeplechase, Irving, Tex. 75062

[21] Appl. No.: 716,542

[22] Filed: Jun. 17, 1991

[51] Int. Cl.⁵ ............................................. H01R 13/00
[52] U.S. Cl. ................................................... 439/266
[58] Field of Search ................................. 439/68–73, 439/259, 260, 261, 264, 265, 266, 270

[56] References Cited

U.S. PATENT DOCUMENTS

| | | | |
|---|---|---|---|
| 4,623,208 | 11/1986 | Kerul et al. | 439/266 |
| 4,691,975 | 9/1987 | Fuukunaga et al. | 439/266 |
| 4,801,273 | 1/1989 | Ikeya et al. | 439/264 |
| 4,886,470 | 12/1989 | Billman et al. | 439/266 |
| 5,009,609 | 4/1991 | Matsuoka et al. | 439/266 |

*Primary Examiner*—Joseph H. McGlynn
*Attorney, Agent, or Firm*—Jack A. Kanz

[57] ABSTRACT

A zero insertion force burn-in and test socket is disclosed which employs a vertically moving top to open and close contact pins which maintain electrical contact with the leads of a surface-mount electronic device package. The socket has a replaceable tray to adapt the socket to various sizes of packages. Horizontal movement of the contact pins is caused and controlled by vertical movement of the top of the socket device.

11 Claims, 2 Drawing Sheets

TEST SOCKET

FIELD OF THE INVENTION

This invention relates to mountings for electronic device packages. More particularly, it relates to mounting devices for use in testing and burn-in of packaged electronic devices.

BACKGROUND OF THE INVENTION

As large scale integration (LSI) techniques are applied to integrated circuit and hybrid circuit development, the density of circuit functions which may be performed by a single circuit chip becomes limited, not by the electronic functions which can be performed by the circuit chip, but by the packaging used to house the chip and the leads required for interconnecting the chip with other circuitry. Integrated circuits are conventionally housed in flat packs or dual in-line package (DIP) structures wherein interconnection leads are arranged in parallel rows extending from opposite sides of the chip housing. However, as the chip functions are expanded to require greater numbers of interconnection leads, standard DIP configurations pose serious limitations. For example, a sixty-eight pin array in conventional DIP packaging would require a DIP over three inches long. Because of impedance of the long leads required, such arrangements are unsuitable for high speed devices. Furthermore, such packages would consume an inordinate amount of circuit board surface area and pose problems in maintenance or replacement.

In response to the need for high density packaging for LSI devices, the industry has developed standard LSI chip carrier housings known in the art as leadless chip carriers. Conventionally, the leadless chip carrier comprises a substantially flat rectangular base piece with the circuit chip centrally located in the body of the base piece. The base piece may be plastic or ceramic. Terminal leads arranged on one or both sides of the base piece adjacent the edges are electrically connected to the circuit chip to provide electrical interconnection to external circuitry. Terminal leads may be in the form of pads or lands formed on the sides and/or edges of the base piece. Alternatively, small leg-like lead structures may extend from the edges of the base piece and be formed so that one face of each lead lies in the same plane and co-planar with or parallel with one face of the package so that the package may be surface-mounted. Often such leads are in the shape of the letter J and are conventionally referred to as J-lead packages. Similarly, such leads may also be in the form of a stretched letter S and are referred to as gullwing leads. However, since J-lead packages and gullwing packages are designed for surface mounting, i.e., attachment to a circuit board by connecting the terminal pads, J-leads or gullwing leads to circuit patterns formed on the same surface of the board on which the package is supported, such packages are conventionally referred to as leadless chip carriers even though they do have small leads extending therefrom, the term "leadless" generally having become synonymous with "surface-mounted" in this regard.

As packages for circuit chips become more compact, the difficulties in holding such packages in such a manner as to make electrical contact with the terminals without damaging the package or the terminals while subjecting the packaged device to burn-in and testing procedures become even more complicated. Various leadless chip carriers have been adopted as industry standards and test sockets designed to accommodate each device package. The industry standard for leadless chip carrier sockets is described, for example, in U.S. Pat. No. 4,191,377 which issued to Wayne K. Pfaff on Jan. 1, 1985.

With the advent of J-lead and gullwing devices, particularly such devices in large pin count configurations, it has become increasingly difficult to make and maintain electrical contact between each of the package terminal leads and the contact pins of the test socket under the adverse conditions encountered in burn-in and testing. Not only do large pin count packages require smaller terminal leads, thus dictating higher accuracy in contact pin alignment, the force required to open a large number of normally closed contacts is directly proportional to the number of contact pins. Furthermore, as pin count increases, the terminal leads become smaller, more delicate and thus more likely to become damaged or bent during testing.

SUMMARY OF THE INVENTION

In accordance with the present invention a test socket is provided which accommodates various surface-mount devices such as J-lead or gullwing lead packages. The socket employs normally closed contacts which are aligned to engage the package leads by moving essentially horizontally to contact the leads. The socket employs a cap or top which moves vertically to simultaneously open all contacts and permit the insertion of a device package vertically therethrough without application of any force to the device package other than gravity. The socket employs a plurality of contact pins which are pivoted about a spring base in such a manner as to move substantially horizontally inwardly toward and outwardly from the device package as the moveable cap moves vertically up or down. However, the contact pins do not rely on the spring base to maintain the contact in the closed position. Instead, the contact pin is moved inwardly and outwardly by an actuation arm which is controlled by the vertically moveable top. Thus the contact pins are moved into and out of engagement with the terminal leads of a device package by positive movement in both directions by the socket cap. In this manner precisely controlled movement of the contact pin is assured and uniform pressure is maintained on the contact pin to maintain engagement with the terminal lead. The terminal lead is engaged at or near the first bend or knee of the lead extending from the package or on the adjacent portion thereof which is substantially vertical. Since contact is made on a portion of the lead which is anchored in the package (instead of its free end) the likelihood of damage or bending of the lead during testing is avoided.

Other features and advantages of the invention will become more readily understood from the following detailed description taken in connection with the appended claims and attached drawing in which:

DESCRIPTION OF THE PREFERRED EMBODIMENT

Figure 1:
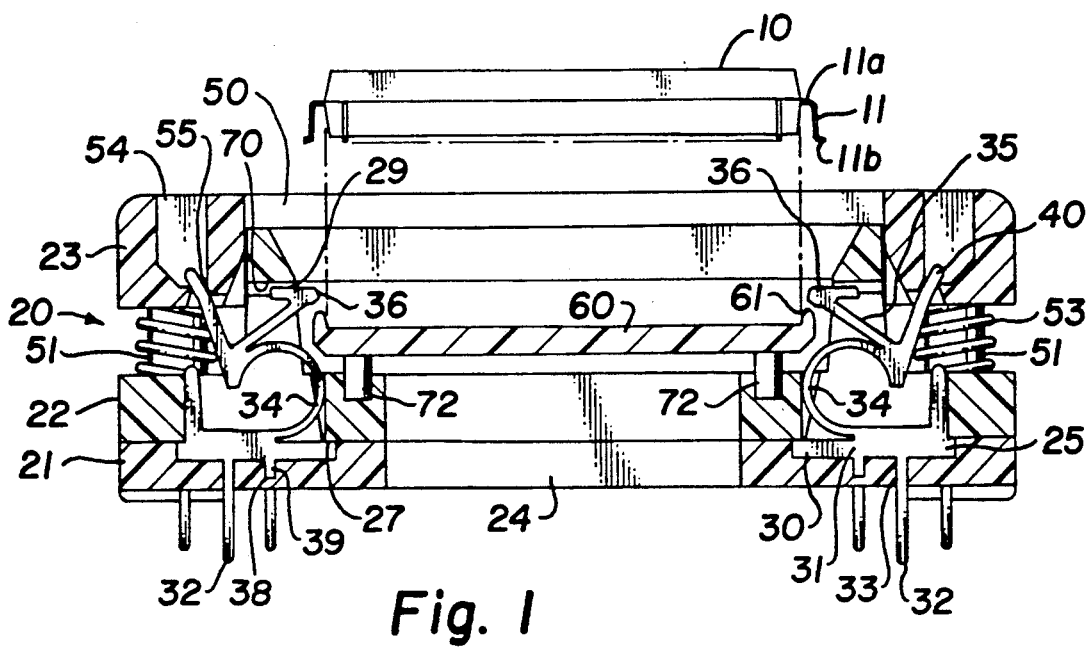
FIG. 1 is a cross-sectional view of the preferred embodiment of the socket of the invention illustrating the positions of the respective internal parts when the socket is empty.
Figure 2:
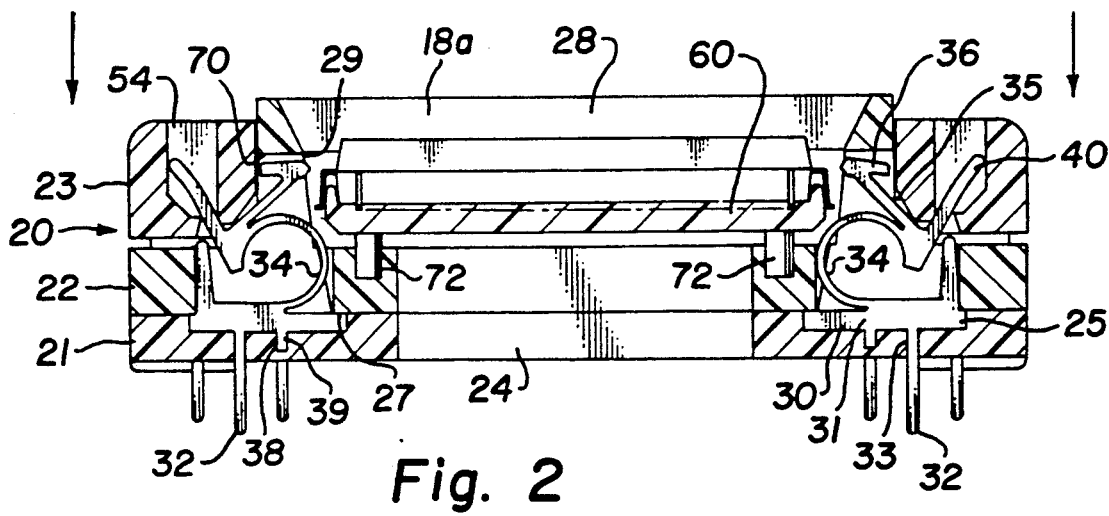
FIG. 2 is a cross-sectional view of the socket of FIG. 1 illustrating the positions of the respective internal parts when the socket is opened and a device package inserted therein.
Figure 3:
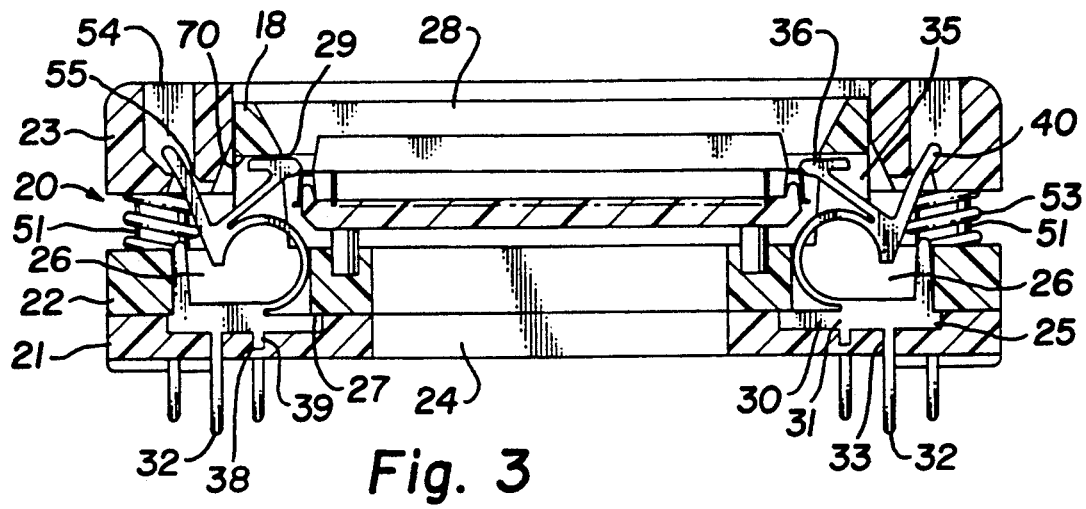
FIG. 3 is a cross-sectional view of the socket of FIG. 1 illustrating the positions of the respective internal parts when an electronic device package is loaded in the socket and the socket contact pins closed for use.

A preferred embodiment of the invention and its method of operation are illustrated in FIGS. 1-3. It will be recognized, however, that FIGS. 1-3 only illustrate the specific embodiment of a socket for an electronic device package known as a quad package having a total of two hundred eight (208) gullwing terminal leads. The invention may, of course, be embodied in sockets of various other pin counts and various other package configurations. For example, sockets as described herein may be designed to accommodate J-lead packages as well as true leadless chip carrier packages which only have contact pads or lands instead of outwardly extending leads. Furthermore, the same principles can be employed in sockets which accept packages having terminal leads on only two sides thereof such as conventional DIP packages and SO packages. Since the inventive concept relates to test socket methods and apparatus in which electrical contact is made to device package leads by moving each contact pin with a control arm which positively controls contact pin movement to both open and close the contacts, the particular shape or type of terminal lead configuration is not a controlling limitation of the invention.

In the specific embodiment illustrated, a socket is provided for a gullwing package 10. The particular package is illustrated essentially square in plan view and has fifty-two (52) leads extending from the centerline of each of its four peripheral edges. The leads are approximately 0.5 mm wide and positioned approximately 0.5 mm apart. As illustrated in FIG. 1, each lead 11 extends laterally outwardly from the edge of package 10 and then bends downwardly at a knee 11a. The lead 11 then bends outwardly near its free end to form a foot 11b. The lower surfaces of all feet 11b of all leads 11 are, upon manufacture, aligned in a single plane parallel with and spaced from the bottom surface plane of the device package 10 by a distance of approximately 0.30 mm. Thus, the package 10 may be surface mounted by aligning the feet 11b with appropriate solder pads on the surface of a circuit board.

It will be readily recognized that because of the number, size and spacing of leads 11, the leads are quite delicate and easily bent or damaged by handling. Bent or damaged leads will not align with the appropriate solder pads. Accordingly, great care must be exercised to avoid misalignment of or other damage to leads 11 between the time of manufacture of the device package and assembly of the device package onto a circuit board. Unfortunately, it is during this period that testing and burn-in occurs. Accordingly, the test and burn-in socket must be designed to avoid causing any damage to the delicate leads 11.

In the socket disclosed herein, the electronic device package is inserted using only the force of gravity on the device package. No other force is applied to insert or remove the package. Thus the likelihood of lead damage resulting from insertion force is eliminated.

Likewise, the device can be removed from the socket by turning the socket over so that the device may be removed by gravity. Alternatively, the device package can be withdrawn from the socket by vacuum means or the like. No other external force is applied to the device package during insertion or removal. Thus the socket is described as a zero insertion force socket.

As will be described in more detail hereinafter, the contact pins of the socket contact the terminal leads 11 at a point which is as near as possible to the device package. Since one end of the lead 11 is secured within the package body, the lead 11 is most stable and least likely to be bent or otherwise damaged if contact is made at or near the knee 11a. Furthermore, knee 11a or an equivalent point is found in all J-lead and gullwing devices. Accordingly, electrical contact at or near the knee 11a is the most desirable configuration.

As illustrated in the drawing, the preferred embodiment of the invention employs three basic body parts which are made of suitable insulating material. In FIGS. 1-3, the socket 20 has a base support 21, central body portion 22 and a reciprocally moveable cap or top portion 23. These components may be formed by conventional methods from various suitable materials such as poly(phenylene sulfide) or the like. The base support 21 is essentially a flat plate with a central aperture 24 and a plurality of channels 25 on its upper surface. Channels 25 are aligned and spaced to accommodate conductive pins 30.

Each conductive pin 30 comprises a base portion 31 which fits in channel 25 in base support 21. Pins 30 are electrically conductive and are preferably stamped from a sheet or ribbon of material such as stainless steel and then coated with a nickel-boron coating. Since the leads 11 are positioned on 1.0 mm centers, the pins 30 are likewise arranged in parallel channels on 1.0 mm centers and are approximately 0.2 mm thick. Each pin 30 has a terminal end 32 which extends from the lower edge of base 31 through an aperture 33 in base support 21. A short alignment stud 39 also extends from the lower edge of base 31 into aperture 38 to assure proper alignment of the contact pin. It will be recognized that the location of stud 39 and terminal end 32 may be reversed in alternate pins to provide output terminal ends 32 arranged in parallel rows for interconnection to a burn-in board or the like and that the pin interconnection arrangement may be otherwise varied as desired.

The central portion of each pin 30 is formed into a curved beam which forms a spring 34. The width or thickness of spring beam 34 is preferably slightly less than that of other portions of the pin so that when force is applied to the pin in the axial direction, the curved beam bends and acts as a resilient spring which tends to restore the pin 30 to the rest condition illustrated in FIG. 1. The central spring portion 34 carries a contact arm 35 and a control arm 40. In the preferred embodiment, curved beam spring portion 34 extends upwardly and outwardly with respect to the body of the socket 20. Control arm 40 extends upwardly and outwardly but contact arm 35 extends upwardly and inwardly toward the interior of the socket. The extreme end of the contact arm 35 terminates in a contact head 36 which projects inwardly toward the interior of the socket 20 and which has a substantially horizontal top edge.

Central body portion 22 is also a substantially flat body having a central aperture which coincides with aperture 24 in base support 21 and is superimposed on the top surface of the base support 21. Body portion 22 defines a cavity 26 to accommodate the conductive pins 30 but includes shoulder 27 which overlaps channels 25 in the base support 21 to entrap the base portion 31 of the contact pins 30 and thus maintain base portion 31 rigidly fixed while permitting spring portion 34 to flex and arms 35 and 40 to pivot about the spring portion 34. Body portion 22 also carries a central body portion 18 which defines a central cavity 28. Central body portion 18 has slots 29 aligned to accept contact arms 35. The upper end 70 of each slot 29 is aligned horizontally and provides an upper limit for vertical movement of contact head 36. The slots 29 extend through the internal walls of body 18 so that contact heads 36 may extend therethrough and into cavity 28.

It will be appreciated that when body portion 22 is in place on base support 21 the contact pins 30 are arranged as desired with the base portions 31 thereof securely locked in place. Means may be provided, if desired, to lock base support 21 and body portion 22 together. Alternatively, base support 21 and body portion 22 may be formed as a unitary piece if appropriately designed.

Top portion 23 has peripheral dimensions equal to the peripheral dimensions of base support 21 and body portion 22. Top portion 23 has a centrally located aperture 50 which mates with the external surface of central body portion 18 so that top portion 23 may be moved reciprocally toward and away from the base support 21. Top portion 22 is preferably secured to base support 21 and body portion 23 by a plurality of bolts, studs or the like. Studs 51 are preferably secured in base support 21. Each stud 51 has an expanded top portion such as a nut or the like and the top portion 23 is adapted for reciprocal movement on the studs 51. A coil spring 53 surrounds each stud 51 between the top portion 23 and body portion 22 to urge the top portion 23 away from the base support 21. Top portion 23 has a channel 54 which has a narrow opening 55 in the base thereof. Opening 55 is sized to receive the control arm 40 extending from each conductive pin 30.

A support carrier 60 is positioned within the cavity 28 defined by the inner walls 18a of body portion 18. The support carrier may have upwardly projecting lips 61 to stabilize the terminal leads 11 as discussed hereinafter. As illustrated in FIGS. 1-3, the internal surfaces 18a of the body portion 18 may slope slightly inwardly to guide the device package 10 into place in the socket 20.

FIGS. 1-3. FIG. 1 illustrates the socket in the unloaded condition. Note that springs 53 have urged the top portion 23 to the uppermost limit. Thus channel 54, acting on control arm 40, has rotated the upper end of pin 30 upwardly and contact head 36 inwardly toward the central cavity.

In FIG. 2 force (illustrated by the arrows) has been applied to the top surface of top 23, thus compressing springs 53 and moving top 23 toward base support 21. Note that as top 23 moves downwardly, channel 54 acts against the upper surface of outwardly inclined control arm 40 to bend spring 34 and cause contact head 36 to be withdrawn outwardly from central cavity 28. Thus movement of the top 23 axially with respect to the contact pins 30 causes the contact head 36 to move substantially radially with respect to the elongated axis of pin 30. With the contact heads 36 withdrawn from the cavity 28, the socket is in an open condition and ready to receive a device package 10.

Device package 10 is inserted into the socket 20 by allowing the package 10 to fall through the aperture in top 23 by gravity. No insertion force is applied, thus no damage can occur to the terminal leads 11. The inner walls 18a of the cavity 28 are preferably sloped to guide the device package into position on carrier 60 so that the device package rests on carrier 60 with lip 61 inserted between leads 11 and the base of device package 10 as illustrated in FIGS. 2 and 3. Lips 61 are preferably spaced to receive the package and prevent its lateral movement within the cavity. The thickness of lips 61 is preferably dimensioned to closely approximate the distance between the package base and the terminal leads 11. Thus the package 20 snugly fits within the carrier but is restrained against horizontal movement. The lips 61 also provide a rigid back support for the terminal leads 11 to prevent their horizontal deformation when contacted by contact heads 36.

After the package is nested in the open socket as illustrated in FIG. 2, downward force on top 23 is released allowing the springs 53 to urge the top 23 upwardly. As illustrated in FIG. 3, upward movement of top 23 causes channel 54 to act on the lower edges of control arm 40. Since control arm 40 is inclined outwardly, upward movement of top 23 causes the control arm to rotate about spring 34. Furthermore, the top 70 of channel 29 prevents upward movement of contact head 36. Instead, contact head 36 is forced to move laterally inwardly within the confines of channel 29. As shown in the drawing, the top 70 of channel 29 is aligned so that contact head 36 engages the lead 11 at or very near the knee 11a. It will be observed that contact head 36 engages the lead 11 before spring 53 is fully released. Thus springs 53, by urging top 23 upwardly, will cause pressure to be applied to lead 11 by contact head 36. Note, however, that pressure is not applied directly or linearly with respect to movement of top 23. Instead, since contact head 36 and control arm 40 are supported on the end of spring 34, the spring 34 may flex to limit the amount of horizontal force exerted on head 36. Thus the control arm 40 and channel 54 positively move the head 36 inwardly and outwardly as the top 23 moves up or down. However, the force exerted on the lead 11 is governed by the flexibility of spring 34.

It should be noted that the slots 29 are formed in the central body portion 18. Thus the upper edges thereof which form the base 70 of channel 29 are stationary and do not move when the contact head 36 moves therein. However, since contact head 36 is on the end of a contact arm 35 which rotates about spring 34, contact head 36 may move up and down within slot 29 but is limited in upward movement by the upper end (the base 70) of slot 29. Thus slot 29 aligns the contact head 36 and the base 70 of the slot 29 forces the head 36 to move horizontally only when it reaches the upper limit defined by upper end 70. However, if top 23 (and thus channel 55) continue to move upwardly after head 36 contacts lead 11, additional force is not necessarily applied to the lead 11. Instead, upward movement of channel 55 applies pressure to the lower side of control arm 40 which flexes spring 34 without applying substantial additional pressure to head 36. The end of head 36, however, may move slightly upwardly or downwardly against lead 11 or slide over knee 11a, thus beneficially applying a wiping action on the lead to remove any oxide or other film which would interfere with electrical contact between head 36 and lead 11.

Unfortunately, the physical dimensions of device packages 10 vary slightly from manufacturer to manufacturer, even though the package 10 is specified as a certain type and size. Because of the precision required in making electrical contact to the leads 11, allowances must be made to compensate for size differences. In the preferred embodiment of the present invention carrier 60 is removable and replaceable. As illustrated in the drawing, carrier 60 has a plurality of legs 72 which are forced into mating apertures in the top surface of body portion 22. Thus carrier 60 may be designed to match the dimensions of each manufacturer's package and the socket adjusted to handle such devices by inserting the appropriate carrier 60.

Figure 4:
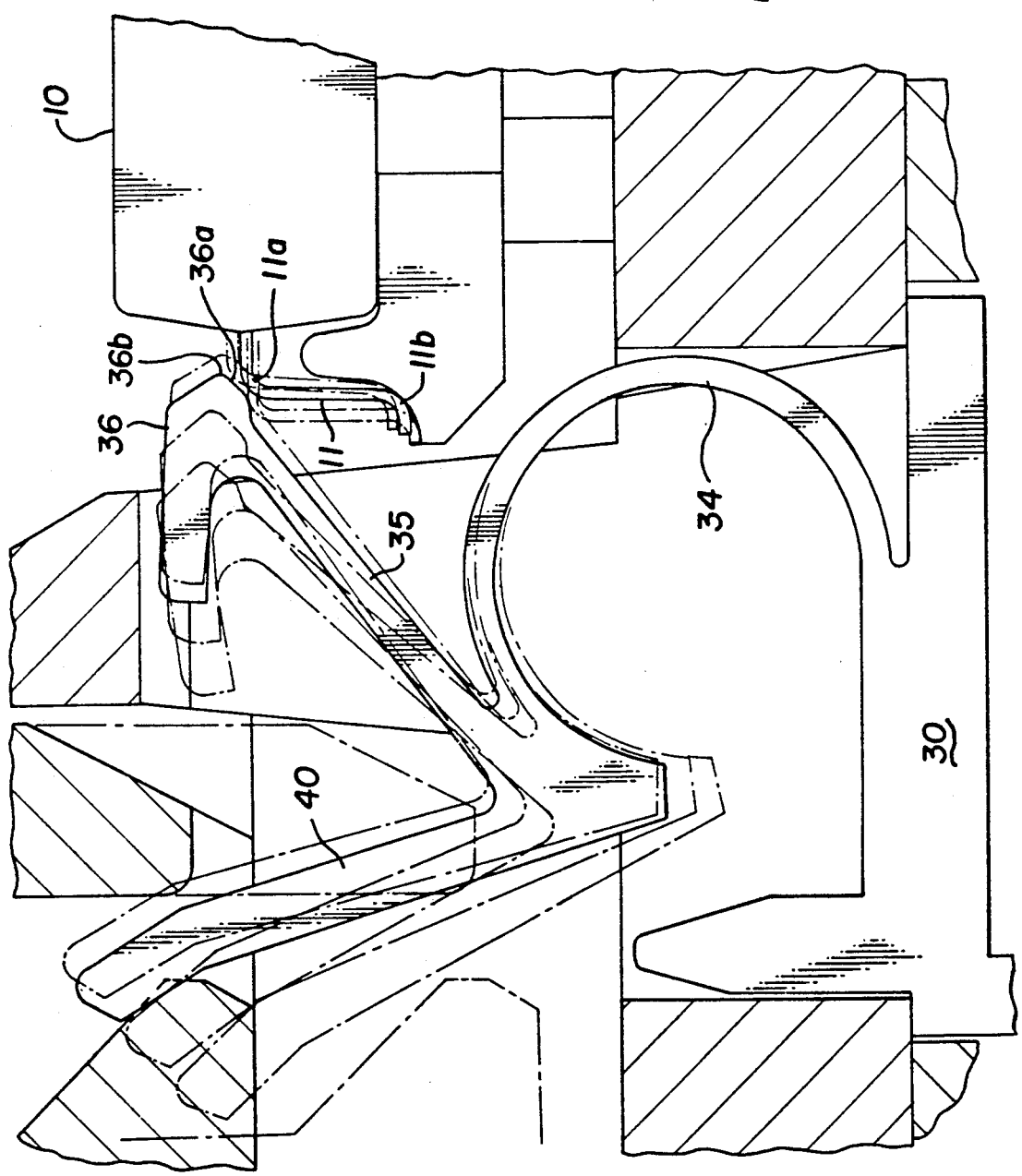
FIG. 4 is an enlarged view of the contact head portion of the contact pin of the preferred embodiment illustrating the electrical interconnection between the contact pin and the device leads.

It has also been determined that the location of the knee 11a on lead 11 with respect to the edge of the device package 10 may also vary from manufacturer to manufacturer. The knee may be, for example, slightly closer to the edge of the device or the lead 11 may extend from slightly above or below the centerline of the device package. To assure that electrical contact is made between the head 36 and the lead 11, the edge of head 36 which contacts the lead 11 is inclined upwardly and inwardly toward the device 10 as more clearly illustrated in FIG. 4. In the preferred embodiment the contacting edge is curved as illustrated in FIG. 4. The inwardly slanting curved edge is aligned so that it contacts the top of the curve on knee 11a. As illustrated in FIG. 4, the inclined or curved edge 36a contacts the knee 11a and slides thereover as the top 23 is raised. Since the edge 36a is inclined or curved, it will intercept and contact the knee 11a so long as the knee 11a is relatively near the proper plane. Furthermore, as the edge 36a rides over the knee 11a, the wiping action beneficially removes oxides and the like, thus assuring good electrical contact.

It should be noted that if the knee 11a is above the curved surface 36a, the extreme end 36b of the head 36 will contact the vertical portion of lead 11, thus assuring electrical contact with the lead regardless of the location of knee 11a.

In order to assure uniform contact and at least some wiping action in forming the electrical contact between lead 11 and contact head 36, the contact head 36 is preferably positioned so that the extreme end 36b is slightly above the expected position of knee 11a. As noted above, the position of knee 11a may vary, depending upon manufacturer, etc. As illustrated in FIG. 4, if the knee 11a is in the expected location, contact will be made between edge 36a and knee 11a. However, if knee 11a is higher than expected (see dashed lines in FIG. 4), contact will be made by the tip 36b. Similarly, if knee 11a extends further out from the package 10, contact will be made by edge 36a on the lower edge of arm 35. In any case, electrical contact is assured, regardless of the position of knee 11a.

It will be observed that the device package 10, when inserted as described above and shown in FIG. 4, is firmly held in place by the contact between contact head 36 and the knee 11a of lead 11 and cannot be easily dislodged by vibration or the like. The device may thus be subjected to normal burn-in and other testing procedures as required while contained in the socket.

Removal of the device package 10 is accomplished by reversing the insertion procedure. As the top 23 is depressed it is moved toward the base support 21, thus moving the control arm 40 outwardly to withdraw contact head 36 into the body portion 18. The device package 10 may then be removed by either withdrawing the package with a vacuum pencil or by turning the socket upside down so that the device package may fall freely from the socket.

As noted hereinabove, the contact mechanism described may be adapted to contact J-lead devices or gullwing devices as well as other packages wherein the contact lead or land is available for contact directly from a horizontal position or a substantially horizontally moving contact head which will slide over the top of the contact lead or land. Accordingly, while the invention has been described with particular reference to a J-lead device package, it will be understood that the same principles may be applied to other device package configurations. It is to be understood, therefore, that although the invention has been described with particular reference to a specific embodiment thereof, the form of the invention shown and described in detail is to be taken as a preferred embodiment of same and that various changes and modifications may be restored to without departing from the spirit and scope of the invention as defined by the appended claims.

What is claimed:

1. Mounting means for an electronic device package comprising:
   (a) support means defining a cavity adapted to receive and support an electronic device package having a plurality of terminal leads aligned along at least one edge thereof;
   (b) a plurality of electrically conductive axially elongated contact pins mounted on said support means, each of said contact pins comprising:
      (i) a base portion having first and second opposite sides;
      (ii) at least one terminal end extending from said first side of said base portion and said support means;
      (iii) a spring portion extending from said opposite side of said base portion;
      (iv) contact means extending from said spring portion; and
      (v) a control arm portion extending from said spring portion; and
   (c) a top portion reciprocally moveable axially with respect to said contact pins toward and away from said support means and having a central opening therein to permit the passage of an electronic device package therethrough, said top portion defining means coacting with the control arms of said contact pins to move said contact means inwardly toward said cavity when said top is moved away from said support means and to move said contact means outwardly away from said cavity when said top is moved toward said support means.

2. Mounting means as defined in claim 1 including spring means urging said top portion away from said support means.

3. Mounting means as defined in claim 1 including removable means mounted within said cavity adapted to control the relative position of a device package mounted thereon.

4. Mounting means as defined in claim 1 including guide means which restricts movement of said contact means in the axial direction.

5. Mounting means as defined in claim 4 wherein said guide means guides said contact means toward said cavity when said top portion is moved away from said support means.

6. Mounting means as defined in claim 5 wherein said means coacting with said control arms urge said contact means toward said cavity when said top portion is moved away from said support means.

7. Mounting means for an electronic device package comprising:
   (a) base support means;
   (b) top means mounted on said base support means and adapted for reciprocal movement toward and from said base support means;
   (c) at least one axially elongated terminal pin mounted in said base support means, said terminal pin having:
      (i) a base portion rigidly secured to said base support means;
      (ii) a curved spring portion extending from said base portion;
      (iii) a control arm extending from said spring portion; and
      (iv) a contact head carried by said spring portion;
   (d) control means carried by said top means which moves axially with respect to said terminal pin when said top means moves toward or from said base support means and which coacts with said control arm to move said contact head generally radially when said control means moves axially; and
   (e) channel means in said base support means which limits axial movement of said contact head and permits radial movement of said contact head.

8. Mounting means as defined in claim 7 including a removable tray mounted within said mounting means for determining the mounting position of said electronic device package with respect to said contact heads.

9. The method of contacting leads of an electronic device package which extend laterally outwardly from the package and then downwardly to define a knee comprising the steps of:
   (a) positioning a plurality of contact pins in an insulating base to define a cavity, each of said contact pins having a curved spring portion and a contact head extending therefrom which defines the cavity;
   (b) simultaneously bending said contact pins outwardly from said cavity;
   (c) positioning an electronic device package having leads which extend outwardly and downwardly to form a knee within said cavity;
   (d) releasing the bending pressure on said contact pins; and
   (e) guiding each said contact head to contact one of said leads in the area of one of said knees.

10. The method set forth in claim 9 including the step of guiding said contact heads to contact said leads by sliding the contact heads over the knees.

11. The method of mounting an electronic device package within a mounting housing comprising the steps of:
   (a) supporting an array of axially elongated contact means having a base portion, a curved beam portion extending from said base portion, and a control arm portion and a contact head portion carried by said spring portion in a pattern on a base support member so that said contact heads define at least two opposite sides of a cavity;
   (b) mounting a reciprocally moveable cap on said base support;
   (c) providing control means within said moveable cap to coact with the control arm portions of said contact means which causes the contact head portion of each contact means to move toward said cavity when said moveable cap is moved away from said base support and causes the contact head portion of each contact means to move away from said cavity when said moveable cap is moved toward base support.

* * * * *

UNITED STATES PATENT AND TRADEMARK OFFICE
CERTIFICATE OF CORRECTION

PATENT NO.  : 5,108,302
DATED       : April 28, 1992
INVENTOR(S) : Wayne K. Pfaff It is certified that error appears in the above-identified patent and that said Letters Patent is hereby corrected as shown below:

Column 5, line 31, change "portion 22" to ---portion 23---.
Column 5, line 32, change "portion 23" to ---portion 22---.
Column 5, line 50, before "FIGS. 1-3." insert ---Operational
        sequences of the socket 20 are illustrated in---.

Signed and Sealed this

Sixth Day of July, 1993

Attest:

MICHAEL K. KIRK

Attesting Officer        Acting Commissioner of Patents and Trademarks